TUNING CIRCUIT FOR MULTI-BAND RECEIVER USING VARIABLE CAPACITANCE DIODES

Filed March 20, 1968

INVENTOR
MITSUNARI OKAZAKI
BY James and Franklin
ATTORNEY

INVENTOR
MITSUNARI OKAZAKI
BY
ATTORNEY

United States Patent Office 3,559,075
Patented Jan. 26, 1971

3,559,075

TUNING CIRCUIT FOR MULTI-BAND RECEIVER USING VARIABLE CAPACITANCE DIODES

Mitsunari Okazaki, Tokyo, Japan, assignor to Alps Electric Company, Limited, Tokyo, Japan, a corporation of Japan Filed Mar. 20, 1968, Ser. No. 714,561
Claims priority, application Japan, July 13, 1967, 42/44,728
Int. Cl. H03j 3/18, 5/00
U.S. Cl. 325—459 8 Claims

ABSTRACT OF THE DISCLOSURE

A receiver adapted to receive signals within two frequency bands comprises separate tuning means, each means being adapted to resonate at frequencies within one of the frequency bands. The tuning means are each provided with signal sensitive capacitances having the characteristic of being operative or inoperative as a capacitor depending upon the polarity of a control signal applied thereto. The polarity of the applied control signal thereby determines which of the tuning means will be operative thereby rendering the receiver effective to receive only signals within the selected frequency band. When a given capacitance is operative as a capacitor, the value of its capacitance may vary depending upon the magnitude of the control signal applied thereto. Hence control signal applying means can select a desired band and can effect tuning within that band.

BACKGROUND OF THE INVENTION

Figure 1A:
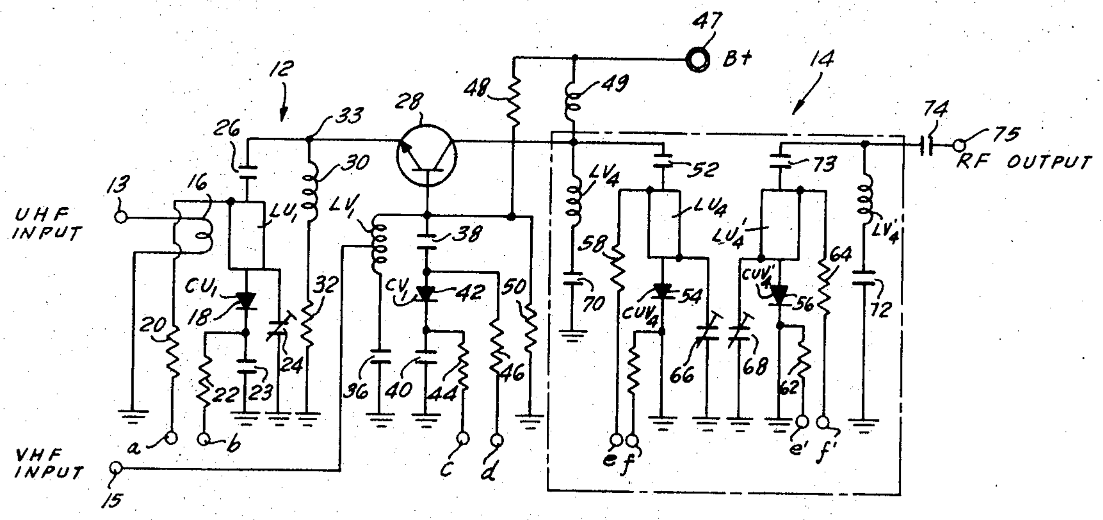

The present invention relates to tuning circuits and, particularly, to a tuning circuit for use in a receiver system, which can receive signals at frequencies within at least two discrete frequency bands and be tunable within these bands.

Television receivers are now generally provided with a channel selector tuning stage capable of receiving channels at frequencies within both the V.H.F. and U.H.F. bands. By the use of both of these frequency bands the number of useful viewing channels available is considerably increased.

In conventional television receivers several approaches have been developed to provide for reception at both the V.H.F. and U.H.F. bands and for tuning within these bands. Usually, separate V.H.F. and U.H.F. tuners are provided, one being connected in the circuit and the other disconnected therefrom by means of a mechanized switch. One or both of these tuners may provide for tuning within its band by using a rotary or turret switch which mechanically inserts or electrically connects preselected tuning inductances within the tuning circuit, each inductance being adapted to resonate at a predetermined desired channel frequency. Alternatively, they may utilize a plurality of mechanically ganged capacitors to synchronously tune the various sections of the tuner.

It is to be noted that in these conventional tuners, band selection, and sometimes channel selection as well, requires the utilization of mechanical device some of which include switch contacts. After prolonged periods of usage these contacts often become worn and fail to make proper electrical connection. This is particularly critical in connection with the high frequency low voltage signals encountered in television tuners.

Furthermore, the addition of U.H.F. receiving capabilities to a conventional V.H.F. television receiver necessitates the incorporation into the tuner of additional mechanical devices such as clutches for control purposes. These devices greatly increase the size of the tuner, as well as its complexity and cost. Thus, for example, a television receiver having both the U.H.F. and V.H.F. receiving capabilities would generally include one mechanical system for selecting channels within the V.H.F. band by mechanically switching the associated inductances into a tuning circuit while a separate mechanical system would be required for switching over to the U.H.F. band and varying its capacitance in the U.H.F. tuning section for channel selection within the U.H.F. band. Desirably a single control knob would be selectively clutch-connected to one or the other of said mechanical systems.

Thus, it will be seen that the requirements of the conventional U.H.F. and V.H.F. receivers increase the cost and complexity of the tuner by requiring the use of a great number of components many of which are mechanical in operation. This factor becomes more pronounced when means for U.H.F. and V.H.F. tuning must be provided in several portions of the tuner, including the high frequency amplifying and selecting stage, the local oscillator stage, and the frequency mixer or converter stage. The cost and complexity of the tuner become even further increased when provision is made for remote control of the tuner of the type frequently provided to facilitate channel selection for home television viewing.

It is, therefore, an object of the present invention to provide an improved dual band tuning circuit for use in a communications receiver wherein the requirement for mechanical switching from one band to the other is substantially eliminated.

It is a further object of the present invention to provide a tuning circuit for use in receiving all channels within first and second frequency bands wherein the selection of the frequency band is effected electrically by varying a selected parameter such as polarity, of a control voltage.

It is a further object of the present invention to provide a tuning circuit for use in a television receiver which is adapted to receive both V.H.F. and U.H.F. signals without the need for complex and bulky mechanical switching and tuning elements.

It is another object of this invention to provide a tuning circuit of the type described wherein the receiver may be switched from V.H.F. to U.H.F. reception, and from U.H.F. to V.H.F. reception by means of a single voltage control.

It is yet a further object of the present invention to provide a tuning circuit for use in a U.H.F. and V.H.F. television receiver wherein channel selection within a preselected band is effected by varying the control voltages applied to certain components within the various stages of the tuning circuit.

It is a further object of this invention to provide a tuning circuit capable of receiving signals within two discrete frequency bands wherein the selection of the desired frequency band is effected by means of the application of a voltage of a specified polarity to voltage sensitive elements in the tuning circuit.

It is another object of the present invention to provide a tuning circuit for use in all tuning stages in a communications receiver wherein the application of voltages of mutually opposite polarity determines the operativeness and inoperativeness of respective tuning elements within each of the tuning stages.

It is a further object of the present invention to provide a tuning circuit for a multi-band communications receiver, wherein the capacitances in the respective tuning sections are rendered operative and inoperative by the application thereto of voltages of mutually opposite polarities.

It is yet another object of the present invention to provide a multi-band tuning circuit in which the sets of tuning elements for each band remain conductively connected to one another no matter which band is selected, one set being rendered operative and the other inoperative by electrical means depending upon which band is chosen.

To these ends, a tuning circuit is provided for use in receiving signals within two discrete frequency bands, such as the V.H.F. and the U.H.F. frequency bands utilized in commercial television reception. The tuning circuit of this invention may be utilized in any or all of the stages of a communications or television receiver wherein frequency resonant or tuning stages are employed. These would include, for example, the high frequency amplification (and selection) stage, the local oscillator stage, and the frequency mixer or converter stage.

The respective tuning circuits each comprise a first and a second tuning section, each section being adapted to a resonate at frequencies within one of the received frequenciy bands. Each tuning section comprises a voltage sensitive means having the characteristic of being operative or inoperative as a capacitance in response to a control signal voltage applied thereto. Means are provided for applying control signal voltages of a predetermined magnitude and polarity to each of the voltage sensitive means so that the tuning circuit is operative at any given time for receiving only one of the input frequency bands.

Preferably the voltage sensitive means comprise variable capacitive means, the capacitance of which varies as a function of the magnitude of the control voltage applied thereto when that voltage is of a polarity such as to cause the device to act as a capacitor. The variable capacitance is in resonant circuit relationship with an inductance provided in the tuning circuit which will resonate at a frequency dependent upon the values of the inductance and the capacitance and, therefore, upon the voltage applied to the variable capacitive means. As here specifically disclosed voltage sensitive means is operative as a capacitor only when a control voltage of a specified polarity is applied thereacross. When a control voltage of an opposite polarity is applied thereto, it acts essentially as a conductor and not as a capacitor and thus no longer is effective in determining the frequency at which its associated tuning stage resonates. Furthermore when the variable capacitance of one tuning section is rendered inoperative by applying a specified polarity of control voltage thereto, a control voltage of the opposite polarity is applied to the variable capacitance of the other tuning section to render the latter operative. As a result, the selection of frequency bands is simply and effectively determined by the relatively simple expedient of applying control voltages of mutually opposite polarities to the variable capacitors in the two tuning sections of an individual tuning stage.

In a preferred embodiment of the present invention, the variable capacitive means, whose value of capacitance is a function of the voltage applied thereto, comprise variable capacitance diodes having the characteristics described above, namely, that they are selectively operative and inoperative as a capacitance depending upon the polarity of the control voltage applied thereto, and that when in operative condition, as capacitors, the magnitude of their capacitances is proportional to the magnitude of the applied control voltage.

The invention is described herein with specific application to a television receiver having the capability of receiving frequency channels within both the U.H.F. and V.H.F. bands. In a typical television receiver, tuning stages are commonly employed in the high frequency amplifier (and selector) stage which receives the RF intelligence signal from the antenna. A local oscillator will produce an RF signal which is displaced in frequency from the selected RF intelligence signal by an amount corresponding to a selected intermediate frequency signal, usually fixed at 4.5 megahertz for conventional television receivers. The outputs of the amplifier and local oscillator are coupled to a mixer or converter stage which develops the intermediate frequency signal corresponding to the difference between the received RF intelligence signal and the local oscillator signal. In the preferred embodiment of this invention each of the tuning stages is provided with alternately operative tuning sections wherein the respective U.H.F. and V.H.F. tuning sections are alternately rendered operative and inoperative in response to the polarity of the control voltages applied thereto.

Figure 1B:
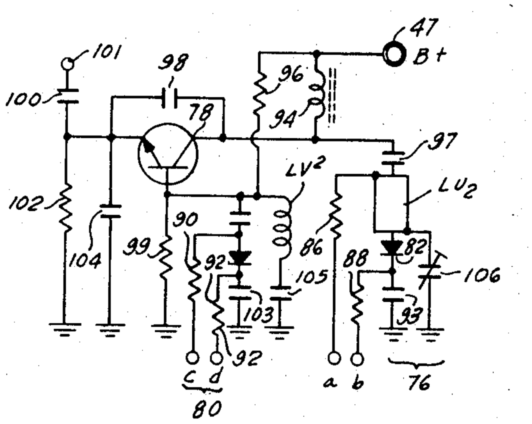
Figure 1C:
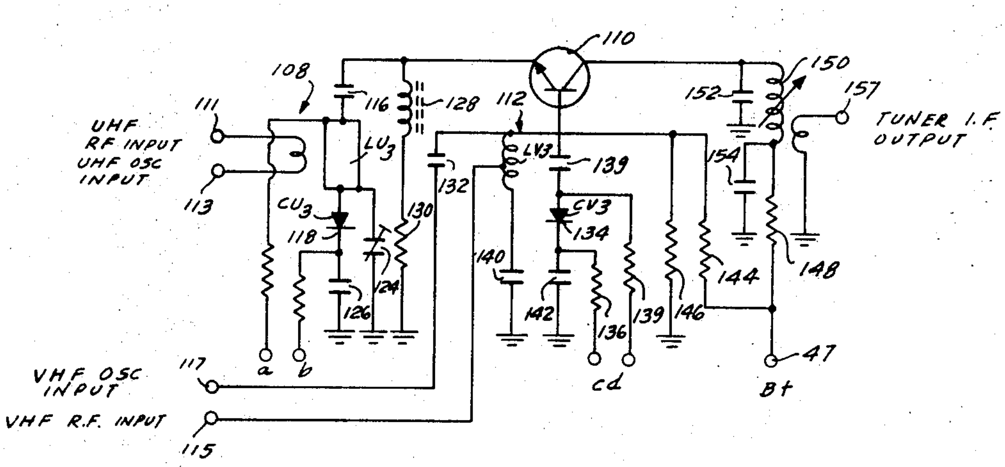
Figures 2A, 2B:
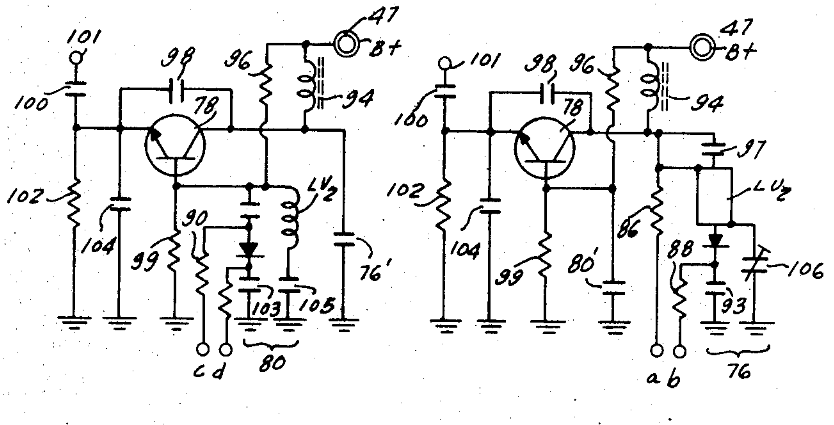

To the accomplishment of the above, and to such other objects as may hereafter appear, the present invention relates to multi-band tuning circuits and tuning systems employing such circuits, as defined in the appended claims and as described in this specification, taken together with the accompanying drawings in which:

FIG. 1*a* is a schematic diagram of a high frequency amplifier incorporating the tuning circuit of the present invention;

FIG. 1*b* is a schematic diagram of a local oscillator stage also incorporating a tuner circuit of the present invention and adapted for cooperation with the amplifier stage of FIG. 1*a*;

FIG. 1*c* is a schematic diagram of a frequency mixer stage incorporating the tuning circuit of this invention and adapted for cooperation with the amplifier stage of FIG. 1*a* and the local oscillator stage of FIG. 1*b*;

FIG. 2*a* is an equivalent circuit of the local oscillator stage of FIG. 1*b* showing the operation of the local oscillator in the V.H.F. reception mode of operation; and FIG. 2*b* is an equivalent schematic diagram of the local oscillator of FIG. 1*b* illustrating the local oscillator in the U.H.F. mode of operation.

Referring now to FIG. 1*a* there is illustrated a schematic diagram of a radio frequency amplifier (and selector) comprising an input tuning and amplifying section generally designated 12 and an output tuning section generally designated 14. The U.H.F. input and V.H.F. input signals are derived from an antenna (not shown) and are applied to the input and amplifying section 12 at terminals 13 and 15 respectively. The U.H.F. input signal is fed to winding 16 which is inductively coupled to a coaxial inductance tuning element $LU_1$. Inductance tuning element $LU_1$, along with the variable capacitance $CU_1$ provided by variable capacitance diode 18 comprises a tuning circuit adapted to resonate at frequencies within the U.H.F. band. Inductance element $LU_1$ is of conventional design for use in high frequency tuning circuits, while variable capacitance diode 18 is a semi-conductor device having the characteristic of being operative as a capacitor when a control voltage of a specified polarity is applied across the terminals thereof. That is, when diode 18 is reverse-biased, the diode will operatively introduce a capacitance across its terminals. When diode 18 is forward biased, diode 18 will become essentially a no-loss conductor having negligible capacitance. When diode 18 is reverse-biased to be operative as a capacitor, the value or magnitude of the capacitance thereof is a function of the magnitude of the reverse bias control voltage applied across its terminals.

The control voltage of a specified polarity and magnitude is applied across terminals *a* and *b* and to diode 18 through impedance matching resistors 20 and 22. A capacitor 23 is connected between the junction of resistor 22 and diode 18 and ground.

A trimmer capacitor 24 is connected between the inductance element $LU_1$ and ground to provide necessary adjustments for precise tuning of the input U.H.F. tuning stage.

The output signal from the U.H.F. tuning stage is coupled through coupling capacitor 26 to the emitter stage of an amplifier transistor 28. An A.C. choke coil 30 in series with a resistor 32 are connected between ground and a point 33 between coupling capacitor 26 and the collector of amplifier 28 to provide an effective D.C. path to ground.

The V.H.F. input signal is applied to a tap of the tuning inductance coil $LV_1$ which comprises, along with variable capacitance $CV_1$, the V.H.F. tuning circuit. One end of inductance $LV_1$ is connected to the base of amplifier transistor 28 while the other end is returned to ground by bypass capcitor 36. Variable capacitor $CV_1$ is connected through capacitor 38 to the base of amplifier transistor 28 while the other end thereof is coupled to ground via bypass capacitor 40. Variable capacitance $CV_1$ is similar to the variable capacitance $CV_1$ of the U.H.F. tuning circuit, in that it represents the capacitance provided by a reverse biased variable capacitance diode 42 having the same properties as that of variable capacitance 18 defined above. The control voltage adapted to be applied to diode 42 is of opposite polarity to that applied to diode 18. This control voltage is applied at terminnals *c* and *d* and is fed to diode 42 via impedance matching resistors 44 and 46. A suitable supply voltage is applied to the base of amplifier transistor 28 from terminal 47 through resistor 48 and to the collector of transistor amplifier 28 through inductance 49. The base circuit of amplifier transistor 28 is connected to ground via resistor 50.

The control voltages applied to terminals *a*, *b* and *c*, *d* respectively may be provided in any appropriate manner. Many circuits and devices are known which are capable of producing such voltages; they form no part of the present invention and hence are not here specifically disclosed.

In accord with a significant aspect of this invention, the control voltage applied to terminals *a* and *b* is of opposite polarity to the voltage applied to terminals *c* and *d*. In this manner only one of the diodes 18 and 42 will be reversed biased at a given time so that only one of them will effectively operate as a capacitance within its respective tuning section at any given time. Thus, it will be appreciated that by selecting the proper polarity of the voltages to be applied to terminals *a* and *b* and *c*, *d*, the amplifier is tuned to receive and select channels only within one of the input frequency bands. This band selection is effected without the need for mechanical switches and mechanical contacts which are required in presently used frequency band selectors.

The output tuning section 14 is coupled to the collector of amplifier 28 through a coupling capacitor 52. The output tuning section 14, which is more completely described in co-pending application Ser. No. 714,640, filed Mar. 20, 1968, in the name of Takeo Suzuki, and assigned to the assignee of the present application, comprises inductively coupled coaxial tuning inductance elements $LU_4$ and $LU_4'$ for use in the U.H.F. reception mode, and inductively coupled inductance coils $LV_4$ and $LV_4'$ for use in the V.H.F. mode of reception. The variable capacitance $CUV_4$ provided by the capacitance of a reverse biased variable capacitance diode 54 is in resonance circuit relationship with both of inductances $LU_4$ and $LV_4$ while variable capacitance $CUV_4'$ provided by the capacitance of a reverse biased variable capacitance diode 56 is in similar resonant circuit relationship with both of inductances $LU_4'$ and $LV_4'$. In order for diodes 54 and 56 to be operative as capacitances, a suitable reverse bias control voltage is applied to diode 54 at terminals *e* and *f* through impedance matching resistors 58 and 60 respectively, while a similar suitable reverse bias voltage is applied to diode 56 at terminals *e'* and *f'* through impedance matching resistors 62 and 64 respectively. As described in said co-pending application, at the U.H.F. frequencies, the tuning inductance coils $LV_4$ and $LV_4'$ operate effectively as no-loss choke coils so that the effective tuning circuits for U.H.F. reception are formed from the resonant pairs of inductance elements $LU_4$ and capacitance $CUV_4$ and inductance element $LU_4'$ and capacitance $CUV_4'$. Alternatively when the input tuning section 12 is operated to receive frequencies within the V.H.F. band, the tuning inductance elements $LU_4$ and $LU_4'$ operate effectively as ordinary conductors having negligible inductance so that the effective tuning operation of the output tuning section 14 is determined by the resonant circuits comprising respectively inductance coil $LV_4$ and capacitance $CUV_4$, and inductance coil $LV_4'$. Trimmer capacitors 66 and 68 are connected between inductance elements $LU_4$ and $LV_4'$ respectively and ground, while A.C. bypass capacitors 70 and 72 are connected between inductance coils $LV_4$ and $LV_4'$ respectively and ground. Capacitor 73 is coupled between one terminal of inductance element $LU_4'$ and a corresponding terminal of inductance coil $LV_4'$. The selected RF output of the high frequency amplifier, which may be either in the U.H.F. or V.H.F. band, is coupled by capacitor 74 to terminal 75 adapted to be connected to the input of the mixer stage which is described below in connection with FIG. 1*c*.

FIG. 1*b* illustrates a local oscillator circuit for producing an RF signal displaced in frequency from the received RF signal by the predetermined intermediate frequency. For operation within a television receiver having both U.H.F. and V.H.F. receiving capabilities, the local oscillator must be able to produce signals at frequencies lying within both of these bands. Accordingly the local oscillator of FIG. 16 comprises a U.H.F. tuning section generally designated 76 connected in the collector circuit of a local oscillator transistor 78, and a V.H.F. tuning section generally designated 80 connected in the base circuit of transistor 78. The U.H.F. tuning section 76 comprises a coaxial tuning inductance element $LU_2$ in resonant circuit relationship with a capacitance $CU_2$ represented by the capacitance of a variable capacitance diode 82. The V.H.F. tuning section 80 comprises a tuning coil $LV_2$ in resonant circuit relationship with a capacitance $CV_2$ represented by the capacitance of variable capacitance diode 84. As described with respect to the amplifier stage of FIG. 1*a*, diodes 82 and 84 are alternatively rendered operative as capacitances by placing a reverse bias control voltage across one of these diodes, while a forward bias control voltage is applied across the other of these diodes. For operation within the U.H.F. mode a reverse bias control voltage is placed across diode 82 and a forward bias control voltage is placed across diode 84. The resulting equivalent circuit is shown in FIG. 20 wherein the V.H.F. tuning section 80 is effectively removed from the local oscillator circuit and replaced by a lossless A.C. conduction path 80' to ground. Therefore the frequency of the signal produced by the local oscillator stage is determined solely by the U.H.F. tuning section 76. By varying the magnitude of the reverse bias control voltage across diode 82, the value of the variable capacitance $CU_2$ is varied so that the frequency output of the local oscillator is accordingly varied.

When V.H.F. operation is desired, the control voltage polarities across the diodes 82 and 84 are reversed, so that diode 84 is reverse biased and diode 82 is forward biased. The effective equivalent circuit in this situation is shown in FIG. 2*a* wherein the U.H.F. tuning section 76 is replaced by an A.C. conduction path 76' to ground and the frequency output of the local oscillator is determined solely by the V.H.F. tuning section 80 comprised of the inductance tuning coil $LV_2$ and the capacitance $CV_2$ of the reverse biased diode 84.

The tuning voltages are applied to diode 82 at terminals *a* and *b* through impedance matching resistors 86 and 88 respectively, while a voltage of the opposite polarity is applied to diode 84 at terminals *c* and *d* through impedance matching resistors 90 and 92 respectively. A bypass capacitor 93 is connected between resistor 88 and ground. A suitable supply voltage from terminal 47 is applied through an A.C. choke 94 to the collector of transistor 78, and through resistor 96 to the base of transistor 78 to establish a suitable bias condition for transistor 78. A capacitor 97 is provided between choke 94 and tuning element $LU_2$. A capacitor 98 is connected between the collector and emitter terminals of transistor 78, and a resistor 99 is connected between the base of transistor 78 and ground. The output signal is taken across the emitter circuit of transistor 78 comprising a resistor 102 parallel with capacitor 104 connected between the emitter and ground, and is coupled by capacitor 100 to output terminal 101. As shown in FIG. 1*b* a trimmer capacitor 106 may be connected between the inductance element $LU_2$ and ground for purposes of adjustment. Bypass capacitor 103 is connected between resistor 92 and ground, and capacitor 105 is connected between inductance tuning coil $LV_2$ and ground. The mixer or converter stage which receives the output of both the amplifier stage of FIG. 1*a* and the local oscillator stage of FIG. 1*b* is illustrated schematically in FIG. 1*c*. The mixer circuit comprises a U.H.F. tuning section generally designated 108 connected in the emitter circuit of transistor 110 and V.H.F. tuning circuit generally designated 112 connected in the base circuit of transistor 110. In the drawing, for purposes of clarity of description terminals 111 and 113 represent the input points of the U.H.F. outputs from the amplifier and oscillator stages respectively while terminals 115 and 117 represent the input points for the corresponding V.H.F. outputs, but it will be understood that both terminals 111 and 115 will be connected to output terminal 76 of the amplifier stage and terminals 113 and 117 will be connected to output terminal 101 of the oscillator stage.

The U.H.F. input from the amplifier stage and the U.H.F. input from the oscillator stage are inductively coupled through winding 114 to the U.H.F. tuning section generally designated 108. U.H.F. tuning section 108 comprises as in the previous embodiments, a coaxial inductive element $LU_3$ coupled through capacitor 116 to the emitter of transistor 110, in resonant circuit relationship with a variable capacitance $CU_3$ represented by the capacitance of a variable capacitance diode 118. In the U.H.F. mode of operation, diode 118 is rendered operative as a capacitance by applying a reverse bias control voltage across its terminals. This voltage is applied at terminals *a* and *b* through impedance matching resistors 120 and 122. A trimmer capacitor 124 is connected between inductance element $LU_3$ and ground and a bypass capacitor 126 is connected between diode 118 and ground. A.C. choke coil 128 in series with a resistor 130 is connected between the emitter of transistor 110 and ground.

The V.H.F. input signals from the amplifier stage and the local oscillator are coupled through capacitor 132 to the tapped portion of tuning inductance coil $LV_3$ of the V.H.F. tuning section 112. Tuning section 112 also comprises the capacitance $CV_3$ in resonant circuit arrangement with inductance coil $LV_3$. Capacitance $CV_3$ is established by applying a reverse bias control voltage across the variable capacitance diode 134, the voltage being applied at terminals *c* and *d* through impedance matching resistors 136 and 138 respectively. Diode 134 is coupled to the base of transistor 110 by a capacitor 139. An A.C. bypass capacitor 140 is connected between one end of coil $LV_3$ and ground and a similar capacitor 142 is connected between the junction of diode 134 and resistor 136 and ground. Supply voltage is applied from terminal 47 to the base of transistor 110 through a voltage divider comprising resistors 144 and 146 and to the collector through resistor 148 and inductance coil 150. A.C. bypass capacitors 152 and 154 are connected between either end of inductance coil 150 and ground. The tuner output, corresponding to the intermediate frequency signal produced by the difference between the RF intelligence signal and the local oscillator signal, is taken across secondary winding 156 inductively coupled to inductance coil 150 and is applied to output terminal 157. The intermediate frequency signal corresponds in frequency to the channel selected in either of the U.H.F. and V.H.F. bands.

The operation of the television receiving system comprising the circuits of FIGS. 1*a–c* can now be described. The choice of V.H.F. or U.H.F. reception is effected by determining the polarity of the tuning voltage applied to the respective variable capacitance diodes within the U.H.F. and V.H.F. uning sections in each of the circuits. That is, a tuning voltage of one polarity will be applied across terminals *a* and *b* of each of the circuits, while a tuning voltage of an opposite polarity will be simultaneously applied across terminals *c* and *d* of each of the receiver circuits. In this manner, either the variable capacitance diodes 18, 82 or 118 within the respective U.H.F. tuning sections, or the variable capacitance diodes 42, 84 or 134 in the V.H.F. tuning sections will be rendered operative as a capacitor depending upon which of the diodes are reverse biased by the tuning voltages. The variable capacitance diodes which are not rendered operative by the application thereto of a reverse biasing control voltage, will be essentially removed from the tuning circuits of their respective receiver stages since the forward biasing control voltage applied thereto will cause them to function essentially as pure conductors. The operative capacitances will be effective to resonate with their associated inductances to tune the respective tuning stages to receive signals only within the selected frequency band. The further choice of channels or stations within each selected band is subsequently determined by varying the magnitude of the applied reverse bias control voltage, this in turn varying the magnitude of the capacitance of the diodes.

It is significant to note that band selection (and tuning within a given band) is accomplished entirely electrically insofar as the tuning circuit is conserved, merely by controlling the polarity (for band selection) and magnitude for tuning within the selected band of an electrical control signal. The means for producing and varying such a control signal are varied, available accurate, and simple. Such signal means may include mechanical switches (although they need not), but if they do the relatively gross nature of the control signal (D.C., and of significant magnitude when compared with the radio frequency signals) means that such switches can be simpler and more reliable, and will have far less deleterious effect on intelligence signal reception, than if such switches are interposed in the radio frequency circuits, as has been the case in the past. Thus, it will be seen that an effective and simple circuit has been provided for tuning a television receiver between channels lying within two discrete frequency bands without the need for complex and bulky mechanical switching arrangements, the switching being accomplished by simply selecting the polarity of a voltage applied to selected variable capacitances within circuits in the receiver. While only one preferred embodiment of the present invention has been herein specifically disclosed, it will be appreciated that variations may be made therein by those skilled in the art without departing from the spirit and scope of this invention, as defined in the following claims.

I claim:

1. A tuning circuit adapted for selected alternate operation at frequencies lying within the V.H.F. and U.H.F. bands, respectively, said tuning circuit comprising: first tuning means comprising inductance means and capacitive means adapted to resonate at frequencies within said V.H.F. band, and second tuning means comprising inductance means and capacitive means adapted to resonate at frequencies within said U.H.F. band, said capacitive means of said first and second tuning means respectively comprising signal sensitive capacitive means having the characteristic of being opreative or inoperative as a capacitor depending upon the signal applied thereto, and means for applying control signals to said signal sensitive capacitive means to render one operative and the other inoperative and vice versa, alternately thereby to cause said tuning circuit to operate selectively at frequencies within one or the other of said frequency bands, said tuning circuit comprising a transistor having output electrodes and a control electrode, said first tuning means being electrically connected between ground and one of said control electrodes, said second tuning means being electrically connected between ground and said control electrode.

2. A circuit as defined in claim 1, in which said first and second tuning means are permanently connected in said tuning circuit, said signal-sensitive capacitor means, when rendered inoperative as a capacitor, constituting essentially the sole means active to cause said tuning signal not to operate in the frequency band associated therewith.

3. The tuning circuit of claim 1, in which said inductance means and capacitive means of said first tuning means are connected in parallel and in which said inductance means and said capacitive means of said second tuning means are connected in series.

4. A circuit as defined in claim 3, in which said first and second tuning means are permanently connected in said tuning circuit, said signal-sensitive capacitor means, when rendered inoperative as a capacitor, constituting essentially the sole means active to cause said tuning signal not to operate in the frequency band associated therewith.

5. The tuning circuit of claim 1, in which said transistor output electrodes comprise emitter and collector, said first tuning means being connected between ground and said emitter.

6. A circuit as defined in claim 5, in which said first and second tuning means are permanently connected in said tuning circuit, said signal-sensitive capacitor means, when rendered inoperative as a capacitor, constituting essentially the sole means active to cause said tuning signal not to operate in the frequency band associated therewith.

7. The tuning circuit of claim 5, in which said inductance means and capacitive means of said first tuning means are connected in parallel and in which said inductance means and said capacitive means of said second tuning means are connected in series.

8. A circuit as defined in claim 7, in which said first and second tuning means are permanently connected in said tuning circuit, said signal-sensitive capacitor means when rendered inoperative as a capacitor, constituting essentially the sole means active to cause said tuning signal not to operate in the frequency band associated therewith.

References Cited

UNITED STATES PATENTS

| | | | |
|---|---|---|---|
| 3,029,339 | 4/1962 | Pan | 307—320 |
| 3,110,004 | 11/1963 | Pope | 307—320 |
| 3,391,347 | 7/1968 | Bosse | 307—320 |
| 3,354,397 | 11/1967 | Wittig | 334—15 |

RICHARD MURRAY, Primary Examiner

H. W. BRITTON, Assistant Examiner

U.S. Cl. X.R.

307—320; 325—460; 334—14